(12) United States Patent
Wirth

(10) Patent No.: US 8,785,951 B2
(45) Date of Patent: Jul. 22, 2014

(54) OPTOELECTRIC COMPONENT

(75) Inventor: Ralph Wirth, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 307 days.

(21) Appl. No.: 12/737,980

(22) PCT Filed: Aug. 4, 2009

(86) PCT No.: PCT/DE2009/001104
§ 371 (c)(1),
(2), (4) Date: Sep. 7, 2011

(87) PCT Pub. No.: WO2010/022699
PCT Pub. Date: Mar. 4, 2010

(65) Prior Publication Data
US 2011/0309392 A1    Dec. 22, 2011

(30) Foreign Application Priority Data
Sep. 1, 2008 (DE) .................. 10 2008 045 331

(51) Int. Cl.
*H01L 33/50* (2010.01)
(52) U.S. Cl.
USPC ............. 257/98; 257/79; 257/99; 257/100; 257/E33.059; 257/E33.061; 257/E33.073; 313/498; 313/502; 313/503
(58) Field of Classification Search
CPC ........... H01L 2224/48091; H01L 2224/48247; H01L 2924/00014; H01L 33/60; H01L 33/62
USPC ........ 257/79, 98, 99, 100, E33.059, E33.061, 257/E33.073; 313/498, 502, 503
See application file for complete search history.

(56) References Cited

U.S. PATENT DOCUMENTS

| | | | |
|---|---|---|---|
| 7,145,181 B2 * | 12/2006 | Wirth | 257/95 |
| 2007/0241661 A1 | 10/2007 | Yin | |
| 2007/0281851 A1 | 12/2007 | Seneschal-Merz et al. | |
| 2008/0054280 A1 * | 3/2008 | Reginelli et al. | 257/98 |
| 2008/0191609 A1 * | 8/2008 | Schmidt et al. | 313/503 |
| 2008/0197368 A1 * | 8/2008 | Harle | 257/98 |
| 2009/0026485 A1 * | 1/2009 | Urano et al. | 257/99 |
| 2011/0079811 A1 * | 4/2011 | Lin et al. | 257/98 |
| 2012/0181919 A1 * | 7/2012 | Wei | 313/503 |

FOREIGN PATENT DOCUMENTS

| | | |
|---|---|---|
| CN | 101027788 | 8/2007 |
| DE | 103 49 038 | 5/2004 |
| DE | 10 2007 049799 | 4/2009 |
| EP | 1840977 | 10/2007 |

(Continued)

OTHER PUBLICATIONS

Philips, "Philips Lumileds' Lumirarmc™ Phosphor Technology will Deliver Significantly Simpler White Color Binning Making Luminaire Design and Manufacture Easier", Aug. 7, 2007, (two pages).

*Primary Examiner* — Matthew W Such
*Assistant Examiner* — David Spalla
(74) *Attorney, Agent, or Firm* — Cozen O'Connor

(57) ABSTRACT

An optoelectronic component (1) is specified, comprising a connection carrier (2) on which a radiation-emitting semiconductor chip (3) is arranged, and a conversion element (4) fixed to the connection carrier (2). The conversion element (4) spans the semiconductor chip (3) in such a way that the semiconductor chip (3) is surrounded by the conversion element (4) and the connection carrier (2), and the conversion element (4) consists of one of the following materials: ceramic, glass ceramic.

17 Claims, 2 Drawing Sheets

(56) References Cited

FOREIGN PATENT DOCUMENTS

| | | |
|---|---|---|
| JP | 2004-352928 | 12/2004 |
| JP | 2006-032726 | 2/2006 |
| JP | 2006-352085 | 12/2006 |
| JP | 2007-035951 | 2/2007 |
| JP | 2008-112866 | 5/2008 |
| JP | 2008-159705 | 7/2008 |
| WO | WO 2006/034703 | 4/2006 |
| WO | WO 2006/111906 | 10/2006 |
| WO | WO 2007/148253 | 12/2007 |
| WO | WO 2008/041566 | 4/2008 |
| WO | WO 2008/056300 | 5/2008 |
| WO | WO 2009/039826 | 4/2009 |

* cited by examiner

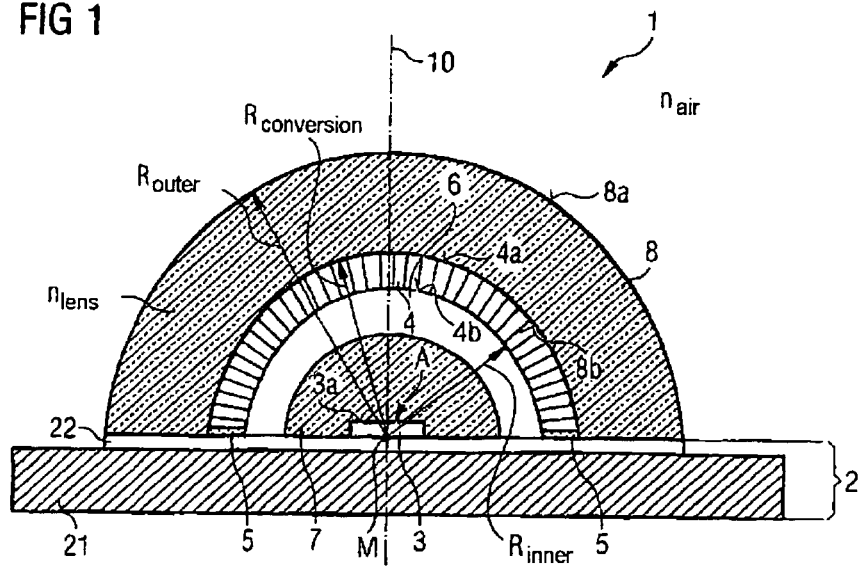
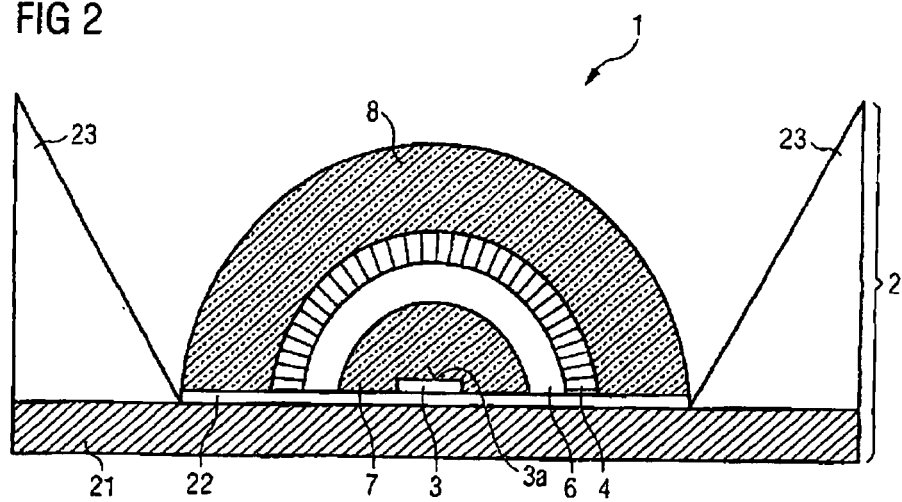

OPTOELECTRIC COMPONENT

CROSS REFERENCE TO RELATED APPLICATION

This patent application is a National Stage of International Application PCT/DE2009/001104 filed Aug. 4, 2009. This patent application claims the priority of German Patent Application 102008045331.5 filed Sep. 1, 2008, the disclosure content of which is hereby incorporated by reference.

BACKGROUND OF THE INVENTION

An optoelectronic component is specified.

One object to be achieved consists in specifying an optoelectronic component wherein heat generated during operation is dissipated particularly efficiently.

In accordance with at least one embodiment of the optoelectronic component, the optoelectronic component comprises a connection carrier, on which a radiation-emitting semiconductor chip is arranged.

The connection carrier is a circuit board, for example, on which or in which are arranged electrical conductor tracks and connection locations which serve for making electrical contact with the radiation-emitting semiconductor chip. The connection carrier is then embodied as substantially planar in the manner of a plate. That is to say that in this case the connection carrier has no cavity in which a radiation-emitting semiconductor chip is arranged.

Furthermore, it is possible for the connection carrier to have at least one cavity for receiving a radiation-emitting semiconductor chip. In this case, the connection carrier can comprise a reflector that reflects electromagnetic radiation generated by the radiation-emitting semiconductor chip during operation. In this case, the connection carrier can be formed, for example, from a carrier strip (also called: leadframe) that is encapsulated by molding with an electrically insulating material such as a plastic or a ceramic material.

The radiation-emitting semiconductor chip is preferably a luminescence diode chip, that is to say a light-emitting diode chip or a laser diode chip. The radiation-emitting semiconductor chip can be suitable for generating electromagnetic radiation in the UV, infrared or visible spectral range.

In accordance with at least one embodiment, the optoelectronic component comprises a conversion element. The conversion element is a component part of the optoelectronic component which contains a luminescence conversion substance or is formed from a luminescence conversion substance.

If, for example, electromagnetic radiation generated by the radiation-emitting semiconductor chip during operation impinges on the conversion element, then the electromagnetic radiation can be completely or partly absorbed by the luminescence conversion substance in the conversion element. The luminescence conversion substance then re-emits electromagnetic radiation comprising other, preferably higher, wavelengths than the electromagnetic radiation emitted by the radiation-emitting semiconductor chip during operation. By way of example, during passage through the conversion element, part of the electromagnetic radiation from the blue spectral range generated by the radiation-emitting semiconductor chip is converted into electromagnetic radiation from the yellow spectral range.

In accordance with at least one embodiment of the optoelectronic component, the conversion element surrounds the semiconductor chip in such a way that the semiconductor chip is surrounded by the conversion element and the connection carrier. That is to say that the conversion element is stretched above the semiconductor chip for example in the manner of a dome.

In other words, the semiconductor chip is then arranged between connection carrier and conversion element. The conversion element forms, for example, a cavity above the semiconductor chip. The semiconductor chip is fixed by its mounting surface onto the connection carrier, for example. At its side surfaces and at its radiation exit surface facing away from the mounting surface the semiconductor chip is surrounded by the conversion element spanning the semiconductor chip. In this case, the conversion element preferably does not directly adjoin the semiconductor chip, rather further materials are arranged between semiconductor chip and conversion element.

In accordance with at least one embodiment of the optoelectronic component, the conversion element consists of one of the following materials: ceramic, glass ceramic. That is to say that the conversion element is not formed by a luminescence conversion substance introduced in silicone or epoxy resin as matrix material, rather the conversion element is formed with a ceramic material or a glass ceramic material.

The conversion element is preferably embodied such that it is mechanically self-supporting. The conversion element can be embodied for example as a self-supporting dome or shell that spans the semiconductor chip. Suitable ceramics for forming such a conversion element are explained in greater detail in the document WO 2007/148253, the disclosure content of which is hereby expressly incorporated by reference. Suitable glass ceramic materials are described for example in the document US 2007/0281851, the disclosure content of which is hereby expressly incorporated by reference. In the present case, a glass ceramic material is preferably not a matrix material composed of glass into which a ceramic material—for example in the form of particles—is introduced. Rather, a combination of sintered-together crystallites and a melt is involved. In particular, the term "glass ceramic" denotes materials which are produced from glass melts by controlled crystallization. The processing of the melt proceeds analogously to the processing in the case of glasses, but the glass is finally converted into a partly crystalline and partly vitreous, ceramic state by means of a special thermal treatment. The result is a glass-like product having new properties.

In accordance with at least one embodiment of the optoelectronic component, the conversion element is fixed to the connection carrier. That is to say that the conversion element has a mechanical, fixed connection to the connection carrier. By way of example, the conversion element can be connected to the connection carrier by means of a thin adhesive layer. Furthermore, it is possible for the conversion element for example to be bonded to the connection carrier or to be connected to the connection carrier by means of a press fit.

In accordance with at least one embodiment of the optoelectronic component, the optoelectronic component comprises a connection carrier on which a radiation-emitting semiconductor chip is arranged, a conversion element fixed to the connection carrier, wherein the conversion element spans the semiconductor chip in such a way that the semiconductor chip is surrounded by the conversion element and the connection carrier, and the conversion element consists of one of the following materials: ceramic, glass ceramic.

In this case, the optoelectronic component described here makes use, inter alia, of the following insight: a glass ceramic material or a luminescent ceramic for the conversion element is generally distinguished by a thermal conductivity that is significantly higher than, for example, the thermal conductivity of silicone. Preferably, the glass ceramic material or the luminescent ceramic has a thermal conductivity of ≥1.0 W/mK.

A conversion element formed from one of said materials is therefore distinguished by a particularly high thermal conductivity. On account of the fixing of the conversion element to the connection carrier, the conversion element is furthermore thermally conductively connected to the connection carrier and thus, for example, to a heat sink on which the connection carrier can be applied. Heat generated during the conversion of radiation passing through in the conversion element can be dissipated particularly well in this way.

By way of example, the conversion element consists of a YAG:Ce ceramic. Such a conversion element is distinguished by a thermal conductivity of approximately 14 W/mK.

Furthermore, a conversion element composed of the materials mentioned forms a mechanically stable protection of the semiconductor chip spanned by the conversion element against external mechanical effects. Therefore, alongside an improved heat balance, the component described is also distinguished by an improved mechanical stability.

In accordance with at least one embodiment of the optoelectronic component, at least one intermediate region is arranged between the semiconductor chip and the conversion element, said at least one intermediate region being filled with a gas. That is to say that the space between semiconductor chip and conversion element can be filled with a gas at least in places. By way of example, said gas can be air. An intermediate region filled with a gas between semiconductor chip and conversion element can further improve the dissipation of heat from the conversion element to the connection carrier on which the semiconductor chip is applied.

In accordance with at least one embodiment, the semiconductor chip is embedded in a shaped body. That is to say that the semiconductor chip is enveloped by the shaped body in a form locking manner at least in places at its uncovered outer surfaces and can be in direct contact with the semiconductor chip at these places.

In this case, the shaped body can be embodied as a potting, for example. The shaped body is as far as possible completely transmissive to the electromagnetic radiation generated by the radiation-emitting semiconductor chip during operation. That is to say that the shaped body consists of a material which absorbs hardly any or no radiation of the radiation-emitting semiconductor chip at all.

By way of example, the shaped body is formed from a silicone, an epoxide, or from a silicone-epoxide hybrid material. The shaped body encloses the semiconductor chip in a form locking manner at the free outer surfaces thereof and can have a spherically curved outer surface, for example.

Preferably, the shaped body is, in particular, free of a radiation-absorbing material such as, for example, a luminescence conversion material. That is to say that the shaped body comprises no luminescence conversion substance apart from extremely small impurities.

In accordance with at least one embodiment of the optoelectronic component, an intermediate region filled with a gas extends between the shaped body and the conversion element. By way of example, the intermediate region is filled with air.

The intermediate region preferably directly adjoins the shaped body. That is to say that the shaped body has an outer surface which faces away from the semiconductor chip and at which said shaped body adjoins the intermediate region. In this case, the intermediate region can extend as far as the connection carrier.

In this case, the intermediate region can be embodied in a dome-like manner. At its inner surface facing the shaped body, it follows the form of the outer surface of the shaped body. At its outer surface facing the conversion element, it can follow the course of the inner surface of the conversion element.

In this case, the intermediate region makes use of the following insight, inter alia: during the operation of the optoelectronic component, as a result of the heating of the radiation-emitting semiconductor chip, the shaped body in which the semiconductor chip is embedded is also subjected to heating. This heating, particularly if the shaped body contains a silicone, can lead to the thermal expansion of the shaped body. The intermediate region is dimensioned, then, in such a way that the shaped body does not come into contact with the conversion element despite said thermal expansion. That is to say that the conversion element and the shaped body, preferably, including during the operation of the optoelectronic component, are always separated from one another by the intermediate region, such that shaped body and conversion element are not in direct contact with one another. This prevents, inter alia, a situation in which, on account of the expanding silicone in the case of a temperature increase, a lift-off of the conversion element arises on account of the pressure of the shaped body on the conversion element.

In accordance with at least one embodiment of the optoelectronic component, the optoelectronic component comprises a coupling-out lens, which adjoins the outer surface of the conversion element, said outer surface facing away from the semiconductor chip. The coupling-out surface can be in direct contact with the outer surface of the conversion element. In this case, the coupling-out lens can constitute a separately produced element of the optoelectronic component which, for example, is milled, turned or injection-molded and fixed above the conversion element in a mounting step.

Furthermore, it is also possible, however for the coupling-out lens to be produced on the further component parts of the optoelectronic component and to be applied for example directly as a potting onto the conversion element.

The coupling-out lens is at least substantially transmissive to the electromagnetic radiation emitted by the optoelectronic component and/or by the conversion element. In particular, the coupling-out lens is preferably free of a luminescence conversion substance. That is to say that the coupling-out lens comprises no luminescence conversion substance apart from extremely small impurities.

In accordance with at least one embodiment of the optoelectronic component, the coupling-out lens has an inner surface, which faces the semiconductor chip and which is enclosed by an inner hemispherical surface having the radius $R_{conversion}$. Furthermore, the coupling-out lens has an outer surface, which faces away from the semiconductor chip and which is encloses an outer hemispherical surface having the radius $R_{outer}$. In this case, the two radii, have the following condition: $R_{outer} \geq R_{conversion} \times n_{lens}/n_{air}$. In this case, $n_{lens}$ and $n_{air}$ are the refractive indices of the coupling-out lens and, respectively, of the surroundings of the coupling-out lens, typically of air.

The inner and outer hemispherical surfaces can be purely virtual surfaces that are not necessarily embodied or do not necessarily occur as substantive features in the component. In particular, the coupling-out lens meets the above-mentioned condition, also known as "Weierstrass" condition, if the hemispherical shell formed by inner and outer hemispherical surfaces having said radii lies in its entirety within the coupling-out lens.

In particular, it is also possible for the coupling-out lens to be embodied as a spherical shell whose inner radius is given by $R_{conversion}$ and whose outer radius is given by $R_{outer}$. In this case, in a manner governed by production, the form of the coupling-out lens can deviate slightly from the mathematically exact spherical form for inner and outer surfaces.

In other words: if the coupling-out lens meets the above-mentioned condition, then the coupling-out lens is shaped and spaced apart from the semiconductor chip in such a way that the outer surface of the coupling-out lens, as seen from every point of the semiconductor chip, appears at such a small angle that no total reflection occurs at the outer side of the coupling-out lens. A coupling-out lens that obeys this condition therefore has only very low radiation losses on account of total reflection at its outer surface. The coupling-out efficiency of the optoelectronic component is thus advantageously increased.

In accordance with at least one embodiment of the optoelectronic component, the shaped body in which the optoelectronic semiconductor chip is embedded is enclosed by a hemispherical surface having the radius $R_{inner}$. In this case, the semiconductor chip has a radiation exit surface having the area content A.

In this case, the area content A and the radius $R_{inner}$ meet the condition $A \leq \frac{1}{2} \times \Pi \times R_{inner}^2$. Preferably, the area content A is in this case $\geq \frac{1}{20} \times \Pi \times R_{inner}^2$. In this case, it is assumed that a single shaped body envelops the radiation-emitting semiconductor chip of the optoelectronic component. Such a small area content of the radiation exit surface of the radiation-emitting semiconductor chip ensures that, for example, electromagnetic radiation reflected back or emitted from the conversion element to the semiconductor chip impinges with low probability on the semiconductor chip, where it might be lost by absorption, for example.

By way of example, in this case, a reflective layer is arranged on that side of the connection carrier which faces the shaped body, said reflective layer directly adjoining the shaped body at least in places and having a reflectivity of at least 80% both for electromagnetic radiation generated by the semiconductor chip and for electromagnetic radiation generated by the conversion element, preferably of at least 90%. Particularly preferably, the reflective layer has a reflectivity of at least 98%. In this case, the reflective layer is preferably situated within the hemisphere having the radius $R_{inner}$. In this way, radiation impinges with high probability on the reflective layer and not on the radiation exit surface of the radiation-emitting semiconductor chip.

In accordance with at least one embodiment of the optoelectronic component, at least one conversion substance is applied to the conversion element, said at least one conversion substance at least partly absorbing electromagnetic radiation generated by the semiconductor chip during operation and/or electromagnetic radiation re-emitted by the conversion element. The conversion substance applied to the conversion element is preferably a conversion substance which is different from the conversion substance from which or with which the conversion element is formed. That is to say that the conversion element and applied conversion substance absorb and/or re-emit electromagnetic radiation having different wavelengths or in different wavelength ranges.

By way of example, the conversion substance can be applied to the inner surface of the conversion element, said inner surface facing the semiconductor chip. That is to say that electromagnetic radiation emitted by the semiconductor chip during operation firstly impinges on the conversion substance arranged at the inner surface of the conversion element. Said conversion substance partly or completely converts the radiation into electromagnetic radiation having a different wavelength. This electromagnetic radiation then passes into the conversion element, which said radiation passes through, without being converted, or in which said radiation is in turn partly or completely converted.

By way of example, the semiconductor chip generates electromagnetic radiation in the UV spectral range during operation. The conversion substance can then be provided for converting said UV radiation at least partly, preferably as far as possible completely, into electromagnetic radiation in a different, for example in the blue, spectral range. The conversion element is then designed to convert part of this converted, blue electromagnetic radiation into electromagnetic radiation in the yellow spectral range, for example. In this way it is possible, by means of a semiconductor chip that generates electromagnetic radiation in the UV range, to realize a component that emits white mixed light.

In this case, applying the additional conversion substance on the conversion element proves to be particularly advantageous with regard to thermal properties of the component as well. This is because heat generated in the conversion substance is emitted to the conversion element, which dissipates the heat to the connection carrier on account of its high thermal conductivity. Preferably, an interspace filled with gas, for example with air, is situated between the semiconductor chip and the shaped body possibly surrounding it, on the one hand, and the conversion substance, on the other hand.

In accordance with at least one embodiment of the optoelectronic component, an adhesive is arranged between the conversion element and the connection carrier, said adhesive directly adjoining the conversion element and the connection carrier. In this case, the adhesive is preferably applied in a thin layer having a thickness of at most 10 μm, preferably at most 6 μm. Such a thin adhesive layer ensures that heat generated by the conversion element can be emitted to the connection carrier particularly efficiently.

In accordance with at least one embodiment of the optoelectronic component, the conversion element and/or the conversion substance contain(s) a luminescence conversion substance or consist(s) of a luminescence conversion substance which is based on one of the following materials: orthosilicate, thiogallates, sulfide, nitride, fluoride.

In accordance with at least one embodiment of the optoelectronic component described here, the conversion element and/or the conversion substance are/is formed with a luminescence conversion substances which is activated by at least one of the following dopants: Eu3+, Mn2+, Mn4+.

In this case, the optoelectronic component described here is based on the following insight, inter alia: as a result of the relatively large distance between semiconductor chip and conversion element and/or conversion substance in the optoelectronic component described here, the electromagnetic radiation generated by the semiconductor chip during operation is distributed over a relatively large area and over a relatively large volume. The use of slowly decaying phosphors is possible as a result. In this case, slowly decaying phosphors are understood to be phosphors which have a decay time of >1 μs. These include luminescence conversion materials activated with Eu3+, Mn2+, Mn4+, for example. As a result of the relatively large distance between the semiconductor chip, conversion element and/or conversion substance, a saturation effect becomes unlikely even in the case of said slowly decaying phosphors. For faster phosphors such as YAG:Ce, for example, which have a shorter decay time, saturation effects are even completely avoided in the case of the present optoelectronic component.

Furthermore, on account of the distribution of the electromagnetic radiation over a larger area and over a larger volume, it is possible to use luminescence conversion materials having an increased sensitivity to radiation damage, for example as a result of UV radiation. Nitrides such as e.g. Sr2Si5N8:Eu and also sulfides, oxynitrides and fluids can be mentioned here by way of example. These luminescence conversion materials can actually be used expediently for the first time in the optoelectronic component as described here.

On account of the fact that the conversion element in accordance with at least one embodiment of the optoelectronic component consists of a ceramic or a glass ceramic, the effective surface area of the phosphor is extremely reduced on account of the sintering of the luminescence conversion substances. As a result, however, slow chemical reactions with moisture, CO2, oxygen or other atmospheric gases are largely prevented since a reduced reaction surface area is available. This concerns, in particular, luminescence conversion substances such as sulfides, orthosilicates or nitrides. On account of the use of a conversion element consisting of ceramic or a glass ceramic, the lifetime of the conversion element and thus of the entire optoelectronic component is thus also increased.

On account of the fact that slowly decaying luminescence conversion materials such as narrowband f-f line emitters (for example Eu3+, Mn4+) can now be used for the first time in conjunction with semiconductor chips that emit UV radiation, it is possible to achieve high color rendering values and efficiency values of the optoelectronic component. The disadvantage of early onset saturation effects does not occur in this case.

Furthermore, in the component described here, it is possible to use luminescence conversion substances having low activator concentrations, with a concentration of up to $\frac{1}{100}$ of what is customary in conventional luminescence conversion substances. That is to say that the component described here also enables the use of luminescence conversion substances which otherwise cannot be used on account of their poor thermal behavior, their sensitivity to atmospheric gases or their slow decay time. These include, for example, blue-green to red-orange emitting orthosilicates, thiogallates, Sulfides, nitride, fluoride and/or narrowband f-f line emitters.

BRIEF DESCRIPTION OF THE DRAWINGS

The optoelectronic component described here is explained in greater detail below on the basis of exemplary embodiments and the associated figures.

FIGS. 1, 2, 3 and 4 show, on the basis of schematic sectional illustrations, different exemplary embodiments of an optoelectronic component described here.

DETAILED DESCRIPTION OF THE DRAWINGS

Figure 3:
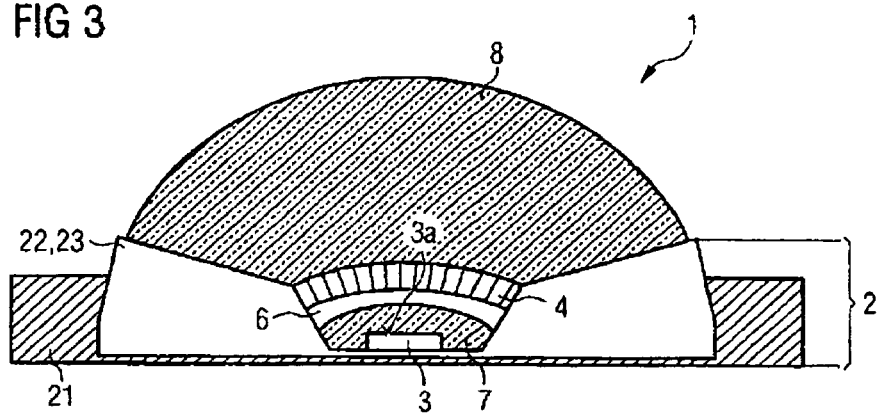

In the figures, elements that are identical, of identical type or act identically are provided with the same reference symbols. The figures and the size relationships of the elements illustrated in the figures among one another should not be regarded as true to scale. Rather, individual elements may be illustrated with exaggerated size in order to enable better illustration and/or in order to afford a better understanding.

FIG. 1 shows, in a schematic sectional illustration, a first exemplary embodiment of an optoelectronic component 1 described here. The optoelectronic component, comprises a connection carrier 2. In the present case, the connection carrier 2 is a circuit board. The connection carrier 2 comprises a base body 21, which can be formed from an electrically insulating material such as a ceramic material or a plastics material. Furthermore, it is possible for the base body 21 to be a metal-core circuit board.

A reflective layer 22 is applied to the top side of the connection carrier. The reflective layer 22 forms a reflective coating of the connection carrier 2. By way of example, the reflective layer 22 is formed from a reflective metal such as gold, silver or aluminum. Furthermore, it is possible for the reflective layer 22 to be a Bragg mirror.

In the present case, a single radiation-emitting semiconductor chip 3 is applied to the connection carrier 2. The radiation-emitting semiconductor chip 3 is a light-emitting diode chip. The radiation-emitting semiconductor chip 3 is fixed and electrically connected on the connection carrier 2.

The radiation-emitting semiconductor chip 3 is enveloped by a shaped body 7. In the present case, the shaped body 7 consists of silicone. The shaped body 7 is embodied in the manner of a hemisphere, for example. The radiation-emitting semiconductor chip 3 is enveloped by the shaped body 7 in a form locking manner at its outer surfaces not facing the connection carrier 2. The shaped body 7 is free of a luminescence conversion substance.

The shaped body 7 is arranged within a hemispherical surface having the radius $R_{inner}$. In this case, the radius $R_{inner}$ is chosen such that the area content of the radiation exit surface 3a of the radiation-emitting semiconductor chip lies between $\frac{1}{20} \times \Pi \times R_{inner}^2$ and $\frac{1}{2} \times \Pi \times R_{inner}^2$. In this way, the probability that, for example, electromagnetic radiation reflected back or emitted by the conversion element 4 does not impinge on the relatively poorly reflective radiation exit surface 3a of the radiation-emitting semiconductor chip 3, but rather on the reflective coating 22, from which it can be emitted again in the direction of the surroundings of the optoelectronic component 1, is reduced.

An interspace 6 is arranged between the shaped body 7 and conversion element 4. The interspace 6 is filled with air. In the exemplary embodiment in FIG. 1, the interspace 6 directly adjoins the shaped body 7 and the conversion element 4. The interspace 6 serves, inter alia, as a buffer for the case where the shaped body 7 expands on account of heating during the operation of the radiation-emitting semiconductor chip 3. On account of the interspace 6 it is ensured in the optoelectronic component 1 that the shaped body 7 does not press against the conversion element 4, which might lead for example to the detachment of the conversion element 4 from the connection carrier 2 and hence to a worsened thermal conductivity from the conversion element 4 to the connection carrier 2.

The conversion element 4 spans the radiation-emitting semiconductor chip 3 in a dome-like manner. The conversion element 4 is embodied in the manner of a hemispherical shell. The conversion element 4 comprises an outer surface 4a and an inner surface 4b, which faces the semiconductor chip 3. It consists of a ceramic, for example YAG:Ce or a sintered glass ceramic, wherein a ceramic luminescence conversion substance is introduced into a glass. In this case, the conversion element 4 is embodied in a self-supporting fashion, that is to say that the conversion element 4 is a mechanically load-bearing structure which requires no further support elements to maintain the dome-like form. The conversion element 4 is fixed on the connection carrier 2. In the present case, the conversion element 4 is fixed to the connection carrier 2 by means of an adhesive layer composed of an adhesive 5, which directly adjoins the connection carrier and the conversion element.

The adhesive 5 is preferably an adhesive formed with epoxy resin and/or silicone. In this case, the adhesive can consist of one of the materials mentioned or contain one of the materials mentioned.

By way of example, it is also possible for one of the materials mentioned to form a matrix material of the adhesive 5', which contains metallic particles such as, for example, particles composed of silver, gold or nickel. An adhesive 5 of this type is then distinguished by an increased thermal conductivity.

Preferably, the conversion element 4 is fixed to the connection carrier 2 by means of a thin adhesive layer composed of the adhesive 5. In this case, the adhesive layer has a—within the scope of the production tolerance—uniform thickness. The thickness of the adhesive layer composed of the adhesive 5 is preferably between 1 µm and 10 µm, particularly preferably between 4 µm and 6 µm, for example 5 µm.

Such a thin adhesive layer composed of the adhesive 5 contributes to the improved dissipation of heat from the conversion element 4 to the connection carrier 2.

During the operation of the radiation-emitting semiconductor chip, electromagnetic radiation is emitted in the direction of the conversion element 4. The conversion element 4 contains or consists of a luminescence conversion substance that converts at least part of said radiation into electromagnetic radiation having a different wavelength or in a different wavelength range. In the process, heat arises, which is emitted from the conversion element 4 to the connection carrier 2. In this case, the conversion element 4 is distinguished, inter alia, by its high thermal conductivity of at least 1.0 W/mK.

The conversion element 4 is succeeded by an outer coupling lens 8 as seen from the radiation-emitting semiconductor chip in the outer direction. The coupling-out lens 8 can be formed from glass or a plastics material such as, for example, silicone, epoxide or epoxide-silicone hybrid material. The coupling-out lens 8 is transparent at least to radiation in the visible spectral range and, in particular, free of a luminescence conversion substance.

The coupling-out lens 8 has a hemispherical inner surface 8b having a radius $R_{conversion}$. Furthermore, the coupling-out lens 8 has an outer surface 8a formed by a hemispherical surface having a radius $R_{outer}$. In this case, all the radii are formed from the point M formed by the point of intersection of the optical axis 10 with the mounting surface of the connection carrier 2. In this case, the optical axis 10 is preferably the central axis through the radiation exit surface 3a of the radiation-emitting semiconductor chip 3, which—within the scope of the production tolerance—is perpendicular to epitaxially grown layers of the radiation-emitting semiconductor chip 3. In this case, the radii for the inner surface 8b and the outer surface 8a of the coupling-out lens B follow the following condition: $R_{outer} \geq R_{conversion} * n_{lens}/n_{air}$, where $n_{lens}$ is the refractive index of the coupling-out lens 8 and $n_{air}$ is the refractive index of the surroundings of the coupling-out lens.

If this condition is met, then for electromagnetic radiation generated by the radiation-emitting semiconductor chip during operation, for radiation re-emitted by the conversion element and also for radiation reflected by the reflective layer 22, the condition for total reflection at the outer surface 8a of the coupling-out lens 8 is not met.

This optical concept is also explained—for a different type of optoelectronic component—in the document DE 102007049799.9, the disclosure content of which is hereby expressly incorporated by reference.

A second exemplary embodiment of an optoelectronic component described here is explained in greater detail in conjunction with FIG. 2. In contrast to the exemplary embodiment in FIG. 1, the connection carrier 2 is supplemented by reflectors 23 in this exemplary embodiment. By way of example, the optoelectronic component comprises a single reflector 23, which is embodied as a circumferential reflector wall around the radiation-emitting semiconductor chip. The reflector is embodied as reflective both for converted and for non-converted electromagnetic radiation, and enables a directional component emission away from the connection carrier 2.

A further exemplary embodiment of an optoelectronic component described here is explained in greater detail in conjunction with FIG. 3. In contrast to the exemplary embodiment described in conjunction with FIG. 2, in the present case the reflector 23 is integrated in the base body 21 of the connection carrier 2. In particular, reflective layers 22 and reflector 23 can be embodied in one piece in this case. Coupling-out lens 8, conversion element 4 and shaped body 7 in each case adjoin the reflector 23. Such a construction leads to a particularly directional and uniform emission characteristic.

The reflector 23 is formed with a metal, for example. By way of example, the reflector 23 can contain silver and/or aluminum or consist of silver and/or aluminum. Furthermore, it is possible for the reflector 23 to be formed with a plastic filled with radiation-reflecting or radiation-scattering particles. By way of example, said particles consist of titanium oxide.

Figure 4:
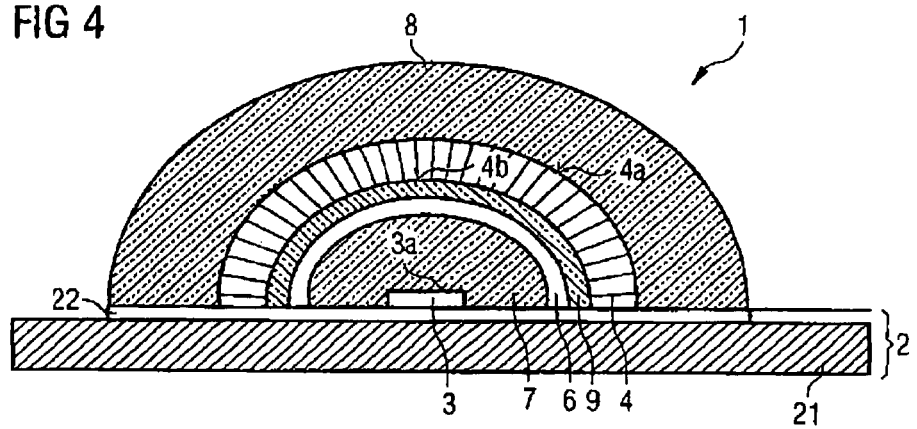

A fourth exemplary embodiment of an optoelectronic component described here is explained in greater detail in conjunction with FIG. 4. In contrast to the component described in conjunction with FIG. 1, the optoelectronic component described in conjunction with FIG. 4 comprises a conversion substance 9 applied as a layer to the inner surface 4b of the conversion element 4. In the present exemplary embodiment, the radiation-emitting semiconductor chip generates electromagnetic radiation in the wavelength range of UV radiation. The luminescence conversion substance 9 converts said radiation for the most part—that is to say at least 80% of the UV radiation—into electromagnetic radiation in the blue spectral range. The conversion element absorbs a portion—for example 50%—of the blue radiation and in return emits electromagnetic radiation in the wavelength range of yellow light. Overall, white mixed light composed of blue and yellow light is then emitted by the optoelectronic component. Fitting the conversion substance 9 to the conversion element 4 provides for particularly good dissipation of heat that arises during conversion to the connection carrier and ultimately to the surroundings of the optoelectronic component.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. An optoelectronic component comprising:
   a connection carrier;
   a reflector integrated within the connection carrier, said reflector having an inclined sidewall with a first region and a second region, said reflector being embodied as a single element, wherein said first region encloses a different angle with a main surface of the connection carrier than said second region, and said first region and said second region directly adjoin each other;
   a conversion element formed as a shell, said conversion element being fixed to said first region of the sidewall of the reflector, wherein the conversion element spans the semiconductor chip in such a way that the semiconductor chip is surrounded by the conversion element, said conversion element consisting of one of the following materials: ceramic, or glass ceramic; and a coupling-out lens arranged over the conversion element in direct contact with the second region of the sidewall of the reflector.

2. The optoelectronic component of claim 1, wherein at least one intermediate region is arranged between the semiconductor chip and the conversion element, said at least one intermediate region being filled with a gas.

3. The optoelectronic component of claim 1, wherein the semiconductor chip is embedded in a shaped body.

4. The optoelectronic component of claim 3, wherein an intermediate region extends between the shaped body and the conversion element, wherein the intermediate region directly adjoins the shaped body.

5. The optoelectronic component of claim 1, wherein the coupling-out lens comprises:
- an inner surface, which faces the semiconductor chip, and which is enclosed by an inner hemispherical surface having the radius $R_{conversion}$, and
- an outer surface, which faces away from the semiconductor chip and which encloses an outer hemispherical surface having the radius $R_{outer}$,
- wherein the radii $R_{conversion}$ and $R_{outer}$ meet the following condition:

$$R_{outer} \geq R_{conversion} * n_{lens}/n_{air},$$

wherein $n_{lens}$ is the refractive index of the coupling-out lens and $n_{air}$ is the refractive index of the surroundings of the coupling-out lens.

6. The optoelectronic component of claim 3, wherein:
the shaped body is enclosed by a hemispherical surface having the radius $R_{inner}$,
the semiconductor chip has a radiation exit surface having the area content A, and
the area content A and the radius $R_{inner}$ meet the condition $$A \leq 1/2 * pi * R_{inner}^2.$$

7. The optoelectronic component of claim 6, wherein the area content A and the radius $R_{inner}$ meet the condition $$A \geq 1/20 * pi * R_{inner}^2.$$

8. The optoelectronic component of claim 1, wherein at least one conversion substance is applied to the conversion element, said at least one conversion substance at least partly absorbing electromagnetic radiation generated by the semiconductor chip during operation and/or electromagnetic radiation re-emitted by the conversion element.

9. The optoelectronic component of claim 8, wherein the conversion substance is applied to the inner surface of the conversion element, said inner surface facing the semiconductor chip.

10. The optoelectronic component of claim 9, wherein:
the semiconductor chip emits electromagnetic radiation in the UV spectral range during operation,
the conversion substance at least partly converts the electromagnetic radiation generated by the semiconductor chip into electromagnetic radiation in the blue spectral range,
the conversion element partly converts the electromagnetic radiation in the blue spectral range re-emitted by the conversion substance into electromagnetic radiation in the yellow spectral range, and
white mixed light is emitted by the component.

11. The optoelectronic component of claim 1, wherein an adhesive is arranged between the conversion element and the connection carrier, said adhesive directly adjoining the conversion element and the connection carrier.

12. The optoelectronic component of claim 3, wherein:
the shaped body is enclosed by a hemispherical surface having the radius $R_{inner}$,
the semiconductor chip has a radiation exit surface having the area content A,
the area content A and the radius $R_{inner}$ meet the condition $A \leq 1/2 * pi * R_{inner}^2$,
the area content A and the radius $R_{inner}$ meet the condition $A \geq 1/20 * pi * R_{inner}^2$, and
a reflective layer is arranged on that side of the connection carrier which faces the shaped body, said reflective layer directly adjoining the shaped body at least in places and having a reflectivity of at least 80% both for electromagnetic radiation generated by the semiconductor chip and for electromagnetic radiation generated by the conversion element.

13. The optoelectronic component of claim 1, wherein the conversion element and/or the conversion substance contain(s) a luminescence conversion substance or consist(s) of a luminescence conversion substance which is based on one of the following materials: orthosilicate, thiogallates, sulfide, nitride, fluoride.

14. The optoelectronic component of claim 1, wherein the conversion element and/or the conversion substance contain(s) a luminescence conversion substance or consist(s) of a luminescence conversion substance which is activated with one of the following dopants: Eu3+, Mn2+, Mn4+.

15. The optoelectric component of claim 1, wherein the conversion element is a mechanically self-supporting shell.

16. The optoelectric component of claim 1, wherein the conversion element is fixed to the connection carrier by means of an adhesion layer.

17. The optoelectronic component of claim 1, wherein the first region of the sidewall surrounds a cavity in which the semiconductor body is mounted.

* * * * *